United States Patent
O'Connell et al.

(10) Patent No.: US 8,779,585 B2
(45) Date of Patent: Jul. 15, 2014

(54) IMPLEMENTING ENHANCED THERMAL CONDUCTIVITY IN STACKED MODULES

(75) Inventors: Kevin M. O'Connell, Rochester, MN (US); Arvind K. Sinha, Rochester, MN (US); Kory W. Weckman, II, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 420 days.

(21) Appl. No.: 13/198,895

(22) Filed: Aug. 5, 2011

(65) Prior Publication Data

US 2013/0032935 A1 Feb. 7, 2013

(51) Int. Cl.
*H01L 23/12* (2006.01)
*H01L 21/44* (2006.01)

(52) U.S. Cl.
USPC ........... 257/727; 257/704; 257/706; 257/713; 257/E23.181; 438/112; 438/125

(58) Field of Classification Search
USPC ................. 257/727, 704, 706, 713, E23.181; 438/112, 125
See application file for complete search history.

(56) References Cited

U.S. PATENT DOCUMENTS

| | | | |
|---|---|---|---|
| 5,109,317 A | 4/1992 | Miyamoto et al. | |
| 5,247,423 A | 9/1993 | Lin et al. | |
| 5,313,099 A | 5/1994 | Tata et al. | |
| 5,371,652 A | 12/1994 | Clemens et al. | |
| 5,386,144 A | 1/1995 | Variot et al. | |
| 5,397,916 A | 3/1995 | Normington | |
| 5,420,751 A | 5/1995 | Burns | |
| 5,499,160 A | 3/1996 | Burns | |
| 5,543,664 A | 8/1996 | Burns | |
| 5,945,736 A * | 8/1999 | Rife et al. | 257/719 |
| 6,049,123 A | 4/2000 | Burns | |
| 6,153,929 A | 11/2000 | Moden et al. | |
| 6,172,874 B1 | 1/2001 | Bartilson | |
| 6,191,480 B1 * | 2/2001 | Kastberg et al. | 257/727 |
| 6,205,654 B1 | 3/2001 | Burns | |
| 6,252,774 B1 | 6/2001 | Rife | |
| 6,396,700 B1 | 5/2002 | Chu et al. | |
| 6,424,533 B1 | 7/2002 | Chu et al. | |
| 6,507,115 B1 | 1/2003 | Hofstee et al. | |

(Continued)

OTHER PUBLICATIONS

U.S. Appl. No. 12/878,710, filed Sep. 9, 2010 by Sinha et al., entitled Electronic Module With Laterally-Conducting Heat Distributor Layer.

(Continued)

*Primary Examiner* — Nitin Parekh
(74) *Attorney, Agent, or Firm* — Joan Pennington

(57) ABSTRACT

A method and structures are provided for implementing enhanced thermal conductivity between a lid and heat sink for stacked modules. A chip lid and lateral heat distributor includes cooperating features for implementing enhanced thermal conductivity. The chip lid includes a groove along an inner side wall including a flat wall surface and a curved edge surface. The lateral heat distributor includes a mating edge portion received within the groove. The mating edge portion includes a bent arm for engaging the curved edge surface groove and a flat portion. The lateral heat distributor is assembled into place with the chip lid, the mating edge portion of the lateral heat distributor bends and snaps into the groove of the chip lid. The bent arm portion presses on the curved surface of the groove, and provides an upward force to push the flat portion against the flat wall surface of the groove.

20 Claims, 3 Drawing Sheets

(56) References Cited

U.S. PATENT DOCUMENTS

| | | |
|---|---|---|
| 6,515,360 B2 | 2/2003 | Matsushima et al. |
| 6,760,224 B2 | 7/2004 | Moden et al. |
| 6,977,434 B2 | 12/2005 | Martino |
| 7,518,873 B2 | 4/2009 | Park et al. |
| 7,521,788 B2 | 4/2009 | Bang et al. |
| 7,564,690 B2 * | 7/2009 | Gilliland et al. .............. 361/719 |
| 7,675,167 B2 * | 3/2010 | Schlomann ................... 257/727 |
| 7,745,952 B2 * | 6/2010 | Nakatsu et al. ................ 307/9.1 |
| 2005/0286234 A1 | 12/2005 | Campbell et al. |
| 2006/0267182 A1 * | 11/2006 | Rumer et al. ................. 257/706 |
| 2007/0066168 A1 | 3/2007 | Small et al. |

OTHER PUBLICATIONS

J. M. Mulligan, "Snap-On Heat Exchanger," IBM Technical Disclosure Bulletin, vol. 10, No. 8, Jan. 1968, p. 1242.

* cited by examiner

IMPLEMENTING ENHANCED THERMAL CONDUCTIVITY IN STACKED MODULES

FIELD OF THE INVENTION

The present invention relates generally to the data processing field, and more particularly, relates to a method and structures for implementing enhanced thermal conductivity between a lid and heat sink for stacked modules.

DESCRIPTION OF THE RELATED ART

A problem exists in providing required heat removal, and manufacturability for electronic modules including a stacked module with two or more chips stacked on top of each other and enclosed within an enclosure or thermally conductive chip lid.

FIG. 3 illustrates a conventional heat sink and lid arrangement for stacked modules. This prior art heat sink and lid arrangement requires heat sink flatness and precision tolerance to achieve this function to provide thermal conductivity between the lid and heat sink for the illustrated multiple chip stacked module. This prior art heat sink and lid arrangement typically results in uneven contact reducing thermal efficiency.

A need exists for an efficient and effective mechanism to implement enhanced thermal conductivity between a lid and heat sink or lateral heat distributor for stacked modules.

SUMMARY OF THE INVENTION

Principal aspects of the present invention are to provide a method and structures for implementing enhanced thermal conductivity between a chip lid and heat sink for stacked modules. Other important aspects of the present invention are to provide such method and structures substantially without negative effects and to overcome many of the disadvantages of prior art arrangements.

In brief, a method and structures are provided for implementing enhanced thermal conductivity between a chip lid and heat sink for stacked modules. A chip lid and lateral heat distributor includes cooperating mating features for implementing enhanced thermal conductivity. The chip lid includes a groove along an inner side wall including a flat wall surface and a curved edge surface. The lateral heat distributor includes a mating edge portion received within the groove. The mating edge portion of the lateral heat distributor includes a bent arm for engaging the curved edge surface groove and a flat portion. When the lateral heat distributor is pressed into place, the mating edge portion bends and snaps into the groove. The bent arm portion of the lateral heat distributor presses on the curved surface of the groove, and provides an upward force to push the flat portion of the lateral heat distributor against the flat wall surface of the groove.

In accordance with features of the invention, spring biasing force resulting from the bent portion engaging the curved groove surface provides enhanced thermal conductivity between the lid and the lateral heat distributor.

In accordance with features of the invention, each of the chip lid and the lateral heat distributor is formed of a thermally conductive material. The lateral heat distributor includes a portion disposed between a first chip and a second chip and a second portion extending laterally outwardly from the first chip and the second chip and including the mating edge portion.

In accordance with features of the invention, the lateral heat distributor includes a separate thermally conductive material layer, which is pushed against the flat surface of the groove. The separate thermally conductive material is carried by the flat portion of the mating edge portion.

In accordance with features of the invention, the lateral heat distributor includes a slight crease defined at a bend location of the bent portion and flat portion of to ensure correct assembly of the mating edge portion of the lateral heat distributor into the groove of the chip lid.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structure are provided for implementing enhanced thermal conductivity between a chip lid and heat sink for multiple stacked modules.

Figure 1:
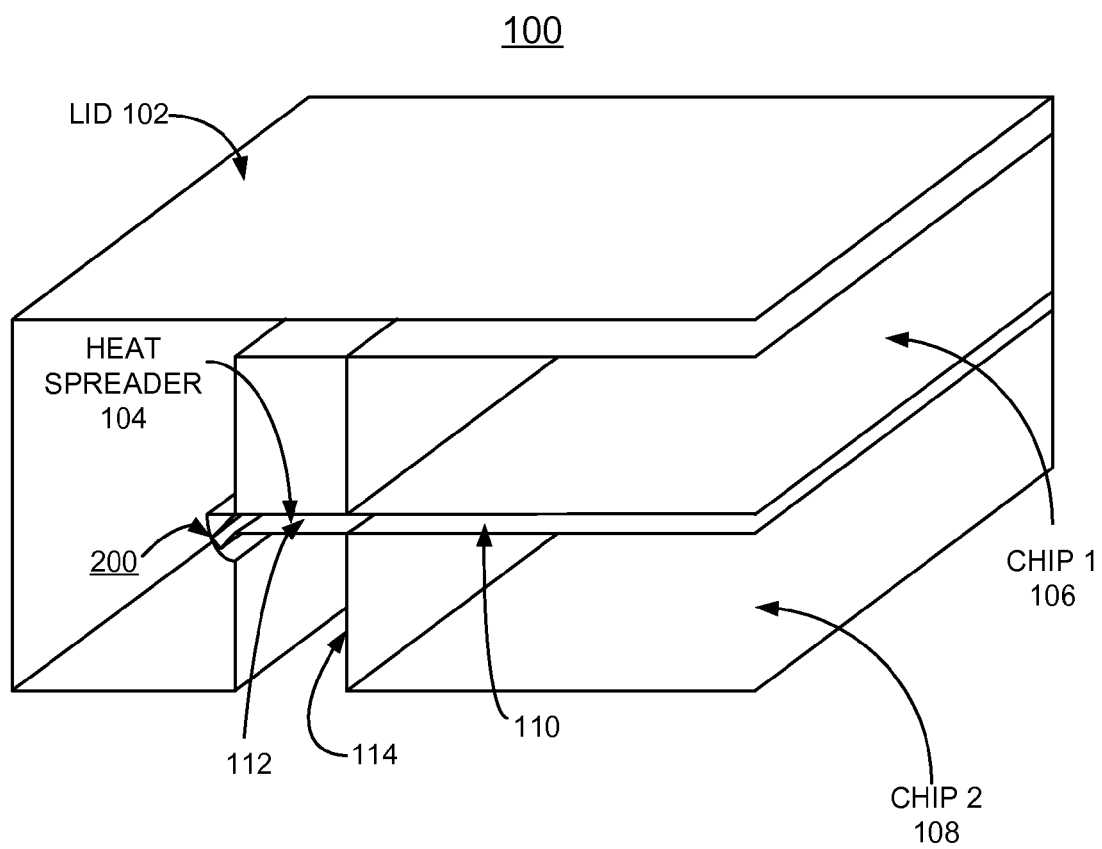
FIGS. 1 and 2 schematically illustrate not to scale a structure for implementing a method to provide enhanced thermal conductivity between a lid and heat sink for stacked modules in accordance with the preferred embodiment.
Figure 2:
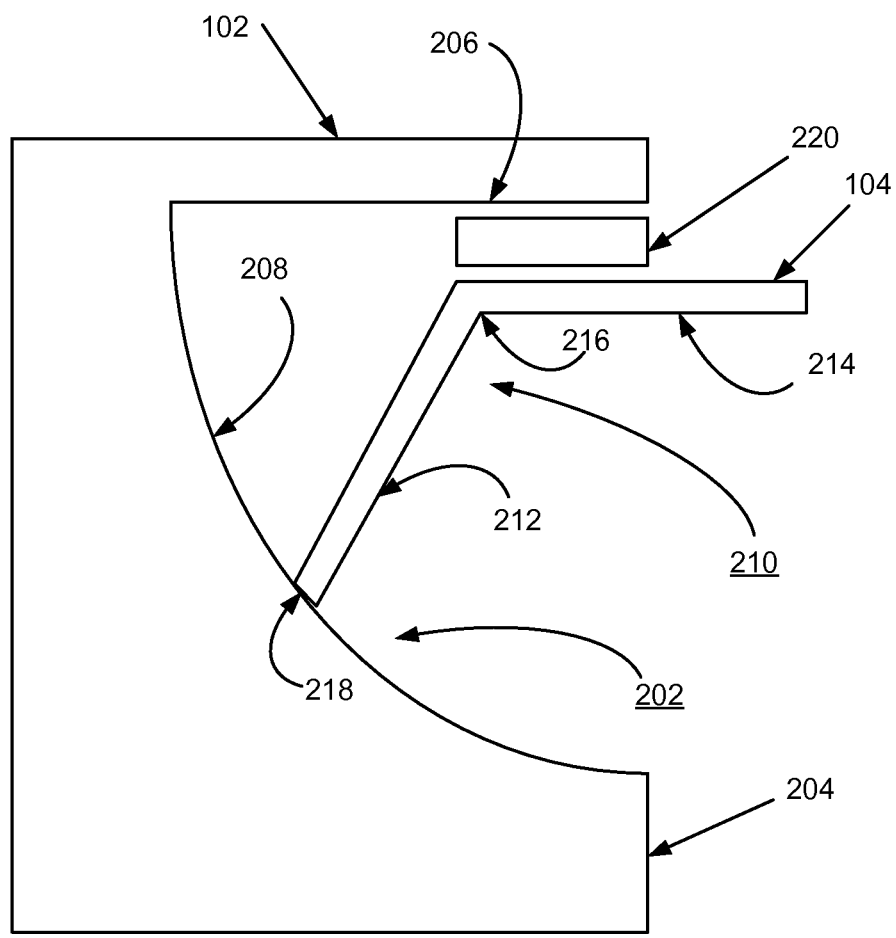
Figure 3:
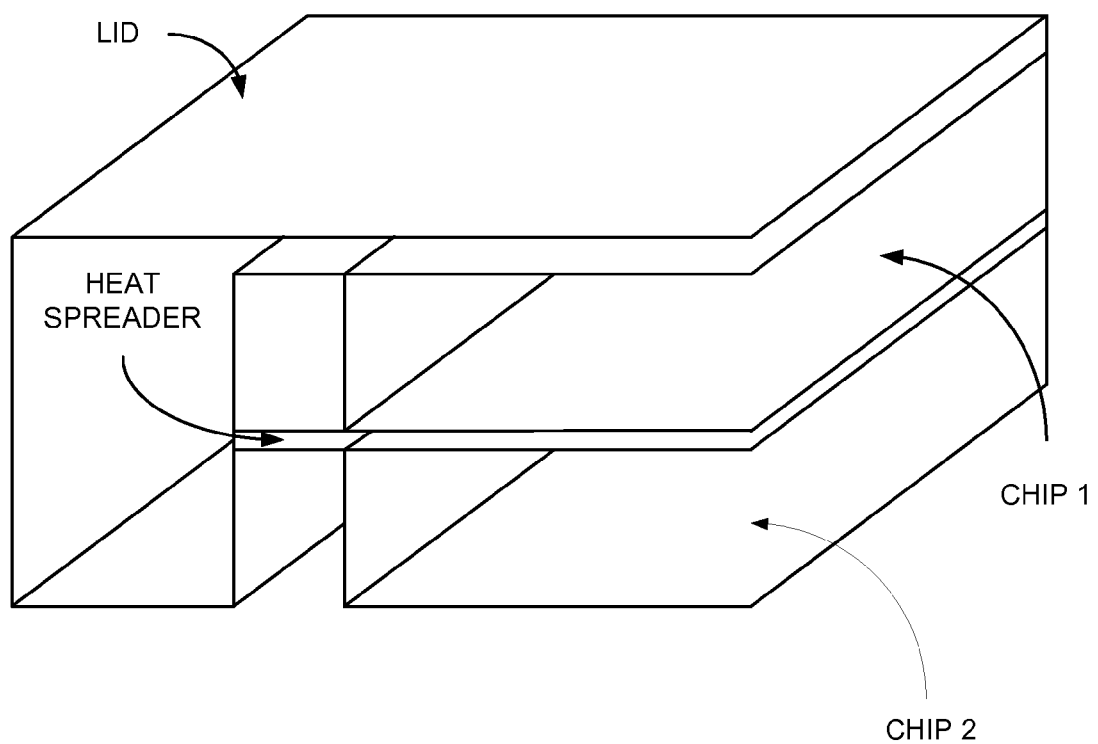
FIG. 3 illustrates a conventional heat sink and lid arrangement for multiple stacked chip modules.

Having reference now to the drawings, in FIGS. 1 and 2, there is shown a structure generally designated by the reference character 100 for implementing enhanced thermal conductivity between a lid 102 and a heat sink member or heat spreader 104 for stacked modules or a stacked chip 1, 106 and a chip 2, 108 in accordance with the preferred embodiment.

The heat spreader 104 is a lateral heat distributor arranged for conducting heat laterally outwardly from the stacked chip 1, 106 and chip 2, 108. The heat spreader 104 is a lateral chip level heat distributor including a first portion 110 extending between the chip 1, 106 and chip 2, 108, and an outwardly extending second portion 112 laterally extending outwardly from an inside edge 114 of the second chip 2, 108.

In accordance with features of the invention, the heat spreader 104 or lateral heat distributor 104 is sized and arranged with the first portion 110 to be positioned between stacked chip 1, 106 and chip 2, 108 and with the second portion 112 to extend beyond the chip edge 114 to physically contact the thermally conductive chip lid 102 with enhanced thermal conductivity provided between the chip lid 102 and the lateral heat distributor 104.

The heat spreader 104 and the chip lid 102 include cooperating heat transfer portions or features generally designated by the reference character 200 implementing enhanced thermal conductivity between the chip lid 102 and the heat spreader 104.

Referring to FIG. 2, there is shown an enlarged detail of the cooperating heat transfer features 200 of the chip lid 102 and the heat spreader 104. The cooperating heat transfer features 200 of the chip lid 102 and lateral heat distributor 104 efficiently and effectively implement enhanced thermal conductivity there between.

The cooperating heat transfer features 200 of the chip lid 102 include a groove generally designated by the reference character 202 formed along an inner side wall 204 of the chip lid 102. The groove 202 includes a flat wall surface 206 and a curved edge surface 208.

The cooperating heat transfer features 200 of the lateral heat distributor includes a mating edge portion generally designated by the reference character 210 received within the groove 202 of the chip lid 102. The mating edge portion 210 of the lateral heat distributor 104 includes a bent arm 212 for engaging the curved edge surface groove and a flat portion 214.

When the lateral heat distributor 104 is pressed into place, the mating edge portion 210 bends and snaps into the groove 102. The lateral heat distributor 104 includes a slight crease indicated at a bend location by reference character 216 of the bent arm or bent portion 212 and the flat portion 214 of to ensure correct assembly of the mating edge portion of the lateral heat distributor into the groove of the chip lid. An end 218 of the bent arm portion 212 of the lateral heat distributor 104 presses on the curved surface 208 of the groove 202, and provides an upward force to push the flat portion 214 of the lateral heat distributor 104 against the flat wall surface 206 of the groove 202.

In accordance with features of the invention, the lateral heat distributor 104 includes a separate thermally conductive material layer 220, which is pushed against the flat surface 206 of the groove 202. The separate thermally conductive material layer 220 is carried by the flat portion 214 of the mating edge portion 210 of the lateral heat distributor 104. The separate thermally conductive material layer 220 is a resilient thermal interface material for contact engagement with the flat wall surface 206 of the chip lid groove 202.

In accordance with features of the invention, spring biasing force results from the bent arm portion 212 engaging the curved groove surface 208 providing enhanced thermal conductivity between the chip lid 102 and the lateral heat distributor 104.

The chip lid 102 and the lateral heat distributor 104 including the enhanced cooperating heat transfer features 200 of the invention are configured, for example, formed of a selected thermally conductive material and having a selected thickness to facilitate needed heat conduction and removal from stack of the chip 1, 106 and chip 2, 108. Each of the chip lid 102 and the lateral heat distributor 104 is formed of a selected thermally conductive material, such as a metal, for example, copper or aluminum, or a non-metal material, such as directional carbon nanotube fibers.

While the present invention has been described with reference to the details of the embodiments of the invention shown in the drawing, these details are not intended to limit the scope of the invention as claimed in the appended claims.

What is claimed is:

1. A structure for implementing enhanced thermal conductivity for stacked modules comprising:
a thermally conductive chip lid;
a lateral heat distributor positioned between a first chip and a second chip;
said chip lid and said lateral heat distributor including cooperating mating features for implementing enhanced thermal conductivity between said chip lid and said lateral heat distributor;
said chip lid including a groove along an inner side wall; said groove including a flat wall surface and a curved edge surface;
said lateral heat distributor including a mating edge portion received within said groove of said chip lid; said mating edge portion including a bent arm for engaging said curved edge surface of said groove and a flat portion for engaging said flat wall surface of said chip lid groove; and
said lateral heat distributor being assembled with said chip lid, said bent arm pressing on the curved edge surface of the groove, and providing an upward force to push said flat portion against said flat wall surface of said chip lid groove via a thermally conductive material layer.

2. The structure as recited in claim 1 wherein the stacked module includes a stack including the first chip and the second chip; and said lateral heat distributor includes a first portion disposed between the first chip and the second chip.

3. The structure as recited in claim 2 wherein said lateral heat distributor includes a second portion extending laterally outwardly from the first chip and the second chip and including said mating edge portion.

4. The structure as recited in claim 1 wherein spring biasing force resulting from the bent portion engaging the curved groove surface provides enhanced thermal conductivity between said chip lid and said lateral heat distributor.

5. The structure as recited in claim 1 wherein said lateral heat distributor includes the thermally conductive material layer disposed thereon.

6. The structure as recited in claim 5 wherein said separate thermally conductive material layer is carried by said flat portion of the mating edge portion and is pushed against the flat wall surface of said chip lid groove.

7. The structure as recited in claim 1 wherein said separate thermally conductive material is a resilient thermal interface material for contact engagement with said flat wall surface of said chip lid groove.

8. The structure as recited in claim 1 wherein said lateral heat distributor includes a crease defined at a bend location of said bent arm and said flat portion of said mating edge portion of the lateral heat distributor to ensure correct assembly of said mating edge portion within said groove of said chip lid.

9. The structure as recited in claim 1 wherein said lateral heat distributor is formed of a selected thermally conductive material.

10. The structure as recited in claim 1 wherein said chip lid is formed of a selected thermally conductive material.

11. The structure as recited in claim 1 wherein said lateral heat distributor is formed of a metal.

12. The structure as recited in claim 1 wherein said lateral heat distributor is formed of a non-metal material.

13. The structure as recited in claim 1 wherein said lateral heat distributor is formed of a directional carbon nanotube fibers.

14. The structure as recited in claim 1 wherein said chip lid is formed of a selected thermally conductive metal material.

15. The structure as recited in claim 1 wherein said chip lid is formed of a selected thermally conductive non-metal material.

16. A method for implementing enhanced thermal conductivity for stacked modules comprising:

providing a thermally conductive chip lid and providing a lateral heat distributor positioned between a first chip and a second chip including cooperating mating features for implementing enhanced thermal conductivity between said chip lid and said lateral heat distributor;
forming said cooperating mating features including
forming a groove along an inner side wall of said chip lid; said groove including a flat wall surface and a curved edge surface;
forming a mating edge portion of said lateral heat distributor, said mating edge portion received within said groove of said chip lid; said mating edge portion including a bent arm for engaging said curved edge surface of said groove and a flat portion for engaging said flat wall surface of said chip lid groove; and
assembling said lateral heat distributor with said chip lid, and said bent arm pressing on the curved edge surface of the groove, and providing an upward force to push said flat portion against said flat wall surface of said chip lid groove via a thermally conductive material layer.

17. The method as recited in claim 16 includes providing the thermally conductive material layer carried by said flat portion of the mating edge portion, said separate thermally conductive material layer engaging said flat wall surface of said chip lid groove.

18. The method as recited in claim 16 includes forming each of said chip lid and said lateral heat distributor of a selected thermally conductive material.

19. The method as recited in claim 16 wherein the stacked module includes a stack including a first chip and a second chip; and wherein providing said lateral heat distributor includes providing said lateral heat distributor including a first portion disposed between the first chip and the second chip.

20. The method as recited in claim 19 includes providing said lateral heat distributor including a second portion extending laterally outwardly from the first chip and the second chip and including said mating edge portion.

* * * * *